US009349481B2

United States Patent
Aritome et al.

(10) Patent No.: US 9,349,481 B2
(45) Date of Patent: May 24, 2016

(54) SEMICONDUCTOR MEMORY DEVICE AND METHOD OF OPERATING THE SAME

(71) Applicant: SK hynix Inc., Gyeonggi-do (KR)

(72) Inventors: Seiichi Aritome, Gyeonggi-do (KR); Soo Jin Wi, Gyeonggi-do (KR); Angelo Visconti, Appiano Gentile (IT); Mattia Robustelli, Milan (IT)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/199,412

(22) Filed: Mar. 6, 2014

(65) Prior Publication Data
US 2014/0185387 A1    Jul. 3, 2014

Related U.S. Application Data

(62) Division of application No. 13/282,029, filed on Oct. 26, 2011, now Pat. No. 8,705,287.

(30) Foreign Application Priority Data

Oct. 27, 2010    (KR) .................. 10-2010-0105339

(51) Int. Cl.
*G11C 16/06*    (2006.01)
*G11C 16/34*    (2006.01)

(52) U.S. Cl.
CPC ............ *G11C 16/3459* (2013.01); *G11C 16/06* (2013.01); *G11C 16/3468* (2013.01); *G11C 16/3454* (2013.01)

(58) Field of Classification Search
CPC ........... G11C 16/3454; G11C 16/3459; G11C 2211/5621; G11C 16/24; G11C 16/3436; G11C 16/34; G11C 13/0064; G11C 16/3413; G11C 16/3431; G11C 16/3463; G11C 16/3486
See application file for complete search history.

(56) References Cited

U.S. PATENT DOCUMENTS

| | | | | |
|---|---|---|---|---|
| 7,656,710 | B1 * | 2/2010 | Wong | .................. 365/185.19 |
| 8,611,155 | B2 * | 12/2013 | Kim | .................. G11C 11/5628 |
| | | | | 365/185.19 |
| 9,236,137 | B2 * | 1/2016 | Aritome | ............. G11C 16/3427 |
| 2008/0239806 | A1 * | 10/2008 | Moschiano | ........ G11C 11/5628 |
| | | | | 365/185.03 |
| 2008/0310222 | A1 * | 12/2008 | Roohparvar | ............. 365/185.03 |
| 2009/0237993 | A1 * | 9/2009 | Yanagidaira et al. | .... 365/185.03 |

* cited by examiner

*Primary Examiner* — Son Dinh
*Assistant Examiner* — Uyen B Tran
(74) *Attorney, Agent, or Firm* — IP & T Group LLP

(57) ABSTRACT

A method of operating a semiconductor memory device includes performing a first program operation in order to raise threshold voltages of memory cells, performing a program verification operation for detecting fast program memory cells, each having a threshold voltage risen higher than a first sub-verification voltage from a second sub-verification voltage or lower, by using a target verification voltage and the first sub-verification voltage and the second sub-verification voltage which are sequentially lower than the target verification voltage, and performing a second program operation under a condition that an increment of each of threshold voltages of memory cells, which is lower than the target verification voltage, is greater than an increment of the threshold voltage of each of the fast program memory cells.

14 Claims, 3 Drawing Sheets

SEMICONDUCTOR MEMORY DEVICE AND METHOD OF OPERATING THE SAME

CROSS-REFERENCE TO RELATED APPLICATION

This application is a division of U.S. patent application Ser. No. 13/282,029 filed on Oct. 26, 2011, which claims priority to Korean patent application number 10-2010-0105339 filed on Oct. 27, 2010. The disclosure of each of the foregoing application is incorporated by reference in its entirety.

BACKGROUND

Exemplary embodiments relate to a semiconductor memory device and a method of operating the same and, more particularly, to a non-volatile memory device and a method of operating the same.

A method of storing data of 2 bits in one memory cell is being used to increase the data storage capacity of a NAND flash memory device. In order to store data of 2 bits in one memory cell, the threshold voltages of the plurality of memory cells are classified into four levels depending on the bit of the data. Data is stored in memory cells through a program operation, and the threshold voltages of the plurality of memory cells rise from the erase level to one of the three program levels depending on the stored data. According to an example, the threshold voltages of the plurality of memory cells rise uniformly. There may be manufactured, however, fast program cells each having a threshold voltage higher than those of normal memory cells under the same program operation condition. Even though the threshold voltages of the normal memory cells are less than a target threshold voltage, the threshold voltages of the fast program cells may be much higher than the target voltage through the same program operation. For this reason, the plurality of memory cells may have a distribution of the threshold voltages that is wide around the target voltage. Here, an error may be generated because the threshold voltages of the fast program cells are considered as being much higher than a selected level.

BRIEF SUMMARY

According to an exemplary embodiment of this disclosure, a distribution of the threshold voltages of memory cells may be prevented from being widened and reliability of the operation thereof may be increased by controlling the threshold voltages of fast program cells, which rise much higher than the threshold voltages of normal memory cells in a program operation.

A method of operating a semiconductor memory device according to an aspect of this disclosure includes performing a first program operation in order to raise threshold voltages of memory cells; performing a program verification operation for detecting fast program memory cells, each having a threshold voltage risen higher than a first sub-verification voltage from a second sub-verification voltage or lower, by using a target verification voltage and the first sub-verification voltage and the second sub-verification voltage which are sequentially lower than the target verification voltage; and performing a second program operation under the condition that an increment of each of threshold voltages of memory cells, which is lower than the target verification voltage, is greater than an increment of the threshold voltage of each of the fast program memory cells.

A method of operating a semiconductor memory device according to another aspect of this disclosure includes performing a first program operation in order to raise threshold voltages of memory cells; performing a program verification operation for detecting fast program memory cells, each having a threshold voltage risen higher than a first sub-verification voltage from a second sub-verification voltage or lower, by using a target verification voltage and the first sub-verification voltage and the second sub-verification voltage which are sequentially lower than the target verification voltage; and performing a second program operation under the condition that an increment of each of threshold voltages of memory cells, which is lower than the first sub-verification voltage, is greater than an increment of each of the threshold voltages of the fast program memory cells and an increment of each of threshold voltages of memory cells, which is higher than the first sub-verification voltage and lower than the target verification voltage.

The program verification operation includes a first sub-verification operation for comparing each of the threshold voltages of the memory cells with the first sub-verification voltage by supplying the first sub-verification voltage to the memory cells, a second sub-verification operation for comparing each of the threshold voltages of the memory cells with the second sub-verification voltage by supplying the second sub-verification voltage to the memory cells, and a target verification operation for comparing each of the threshold voltages of the memory cells with the target verification voltage by supplying the target verification voltage to the memory cells.

The method further includes raising the level of a program voltage supplied to the memory cells, before performing the second program operation. The program verification operation, the rise in the level of the program voltage, and the second program operation may be repeatedly performed until each of the threshold voltages of the memory cells becomes higher than the target verification voltage.

When the second program operation is performed, a first program permission voltage may be supplied to the bit lines of memory cells, each having the threshold voltage lower than the second sub-verification voltage, a second program permission voltage higher than the first program permission voltage may be supplied to the bit lines of the fast program memory cells, and a program inhibition voltage higher than the second program permission voltage may be supplied to the bit lines of memory cells, each having the threshold voltage higher than the target verification voltage.

The second program operation may be performed under the condition that an increment of each of the threshold voltages of memory cells which is higher than the first sub-verification voltage, but lower than the target verification voltage, is greater than an increment of each of the threshold voltages of the fast program memory cells.

When the second program operation is performed, a first program permission voltage may be supplied to the bit lines of memory cells, each having the threshold voltage lower than the second sub-verification voltage, a second program permission voltage higher than the first program permission voltage may be supplied to the bit lines of memory cells, each having the threshold voltage higher than the first sub-verification voltage, but lower than the target verification voltage, a third program permission voltage higher than the second program permission voltage may be supplied to the bit lines of the fast program memory cells, and a program inhibition voltage higher than the third program permission voltage may be supplied to the bit lines of memory cells, each having the threshold voltage higher than the target verification voltage.

A method of operating a semiconductor memory device according to yet another aspect of this disclosure includes performing a first program operation in order to raise threshold voltages of memory cells; performing a program verification operation for detecting first fast program memory cells, each having a threshold voltage risen higher than a second sub-verification voltage from a third sub-verification voltage or lower, and second fast program memory cells, each having a threshold voltage risen higher than a first sub-verification voltage from the third sub-verification voltage or lower, by using a target verification voltage and the first sub-verification voltage, the second sub-verification voltage, and the third sub-verification voltage which are sequentially lower than the target verification voltage; and performing a second program operation under the condition that an increment of each of the threshold voltages of memory cells, which is lower than the second sub-verification voltage, is greater than an increment of each of the threshold voltages of the first and the second fast program memory cells.

The program verification operation includes a first sub-verification operation for comparing each of the threshold voltages of the memory cells with the first sub-verification voltage by supplying the first sub-verification voltage to the memory cells, a second sub-verification operation for comparing each of the threshold voltages of the memory cells with the second sub-verification voltage by supplying the second sub-verification voltage to the memory cells, a third sub-verification operation for comparing each of the threshold voltages of the memory cells with the third sub-verification voltage by supplying the third sub-verification voltage to the memory cells, and a target verification operation for comparing each of the threshold voltages of the memory cells with the target verification voltage by supplying the target verification voltage to the memory cells.

The method may further include raising the level of a program voltage supplied to the memory cells, before performing the second program operation. The program verification operation, the rise in the level of the program voltage, and the second program operation may be repeatedly performed until each of the threshold voltages of the memory cells becomes higher than the target verification voltage.

The second program operation may be performed under the condition that an increment of each of the threshold voltages of the second fast program memory cells is smaller than an increment of each of the threshold voltages of the first fast program memory cells.

The second program operation may be performed under the condition that an increment of each of the threshold voltages of memory cells which is lower than the first sub-verification voltage is greater than an increment of each of the threshold voltages of memory cells which is higher than the first sub-verification voltage, but lower than the target verification voltage.

When the second program operation is performed, a first program permission voltage may be supplied to the bit lines of memory cells, each having the threshold voltage lower than the second sub-verification voltage, a second program permission voltage higher than the first program permission voltage may be supplied to the bit lines of memory cells, each having the threshold voltage higher than the first sub-verification voltage, but lower than the target verification voltage, a third program permission voltage higher than the second program permission voltage may be supplied to the bit lines of the fast program memory cells, a fourth program permission voltage higher than the third program permission voltage may be supplied to the bit lines of the second fast program memory cells, and a program inhibition voltage higher than the fourth program permission voltage may be supplied to the bit lines of memory cells, each having the threshold voltage higher than the target verification voltage.

A semiconductor memory device according to still yet another aspect of this disclosure includes a memory array configured to include memory cells; an operation circuit group configured to perform a program operation for the memory cells and to detect detecting fast program memory cells, each having a threshold voltage risen higher than a first sub-verification voltage from a second sub-verification voltage or lower, by using a target verification voltage and the first sub-verification voltage and the second sub-verification voltage which are sequentially lower than the target verification voltage; and a control circuit configured to control the operation circuit group in order to perform the program operation under a condition that an increment of each of threshold voltages of memory cells, which is lower than the target verification voltage, is greater than an increment of the threshold voltage of each of the fast program memory cells.

When the second program operation is performed, the operation circuit group may be configured to supply a first program permission voltage to the bit lines of memory cells, each having the threshold voltage lower than the second sub-verification voltage, supply a second program permission voltage higher than the first program permission voltage to the bit lines of the fast program memory cells, and supply a program inhibition voltage higher than the second program permission voltage to the bit lines of memory cells, each having the threshold voltage higher than the target verification voltage.

The control circuit may control the operation circuit group so that the second program operation is performed under the condition that an increment of each of the threshold voltages of memory cells which is lower than the first sub-verification voltage is greater than an increment of each of the threshold voltages of memory cells which is higher than the first sub-verification voltage, but lower than the target verification voltage.

When the second program operation is performed, the operation circuit group may be configured to supply a first program permission voltage to the bit lines of memory cells, each having the threshold voltage lower than the second sub-verification voltage, supply a second program permission voltage higher than the first program permission voltage to the bit lines of memory cells, each having the threshold voltage higher than the first sub-verification voltage, but lower than the target verification voltage, supply a third program permission voltage higher than the second program permission voltage to the bit lines of the fast program memory cells, and supply a program inhibition voltage higher than the third program permission voltage to the bit lines of memory cells, each having the threshold voltage higher than the target verification voltage.

A semiconductor memory device according to further yet another aspect of this disclosure includes a memory array configured to include memory cells; an operation circuit group configured to perform a program operation for the memory cells and to detect first fast program memory cells, each having a threshold voltage risen higher than a second sub-verification voltage from a third sub-verification voltage or lower, and second fast program memory cells, each having a threshold voltage risen higher than a first sub-verification voltage from the third sub-verification voltage or lower, by using a target verification voltage and the first sub-verification voltage, the second sub-verification voltage, and the third sub-verification voltage which are sequentially lower than the target verification voltage; and a control circuit configured to control the operation circuit group in order perform the program operation under the condition that an increment of each of the threshold voltages of memory cells, which is lower than the second sub-verification voltage, is greater than an increment of each of the threshold voltages of the first and the second fast program memory cells.

The operation circuit group may perform the program operation under the condition that each of the threshold voltages of the second fast program memory cells becomes slightly higher than each of the threshold voltages of the first fast program memory cells.

The operation circuit group may perform the program operation under the condition that an increment of each of the threshold voltages of memory cells which is lower than the first sub-verification voltage is greater than an increment of each of the threshold voltages of memory cells which is higher than the first sub-verification voltage, but lower than the target verification voltage.

When the second program operation is performed, the operation circuit group may be configured to supply a first program permission voltage to the bit lines of memory cells, each having the threshold voltage lower than the second sub-verification voltage, supply a second program permission voltage higher than the first program permission voltage to the bit lines of memory cells, each having the threshold voltage higher than the first sub-verification voltage, but lower than the target verification voltage, supply a third program permission voltage higher than the second program permission voltage to the bit lines of the fast program memory cells, supply a fourth program permission voltage higher than the third program permission voltage to the bit lines of the second fast program memory cells, and supply a program inhibition voltage higher than the fourth program permission voltage to the bit lines of memory cells, each having the threshold voltage higher than the target verification voltage.

DESCRIPTION OF EMBODIMENTS

Hereinafter, some exemplary embodiments of the present disclosure will be described in detail with reference to the accompanying drawings. The figures are provided to enable those of ordinary skill in the art to make and use the embodiments of the disclosure.

Figure 1:
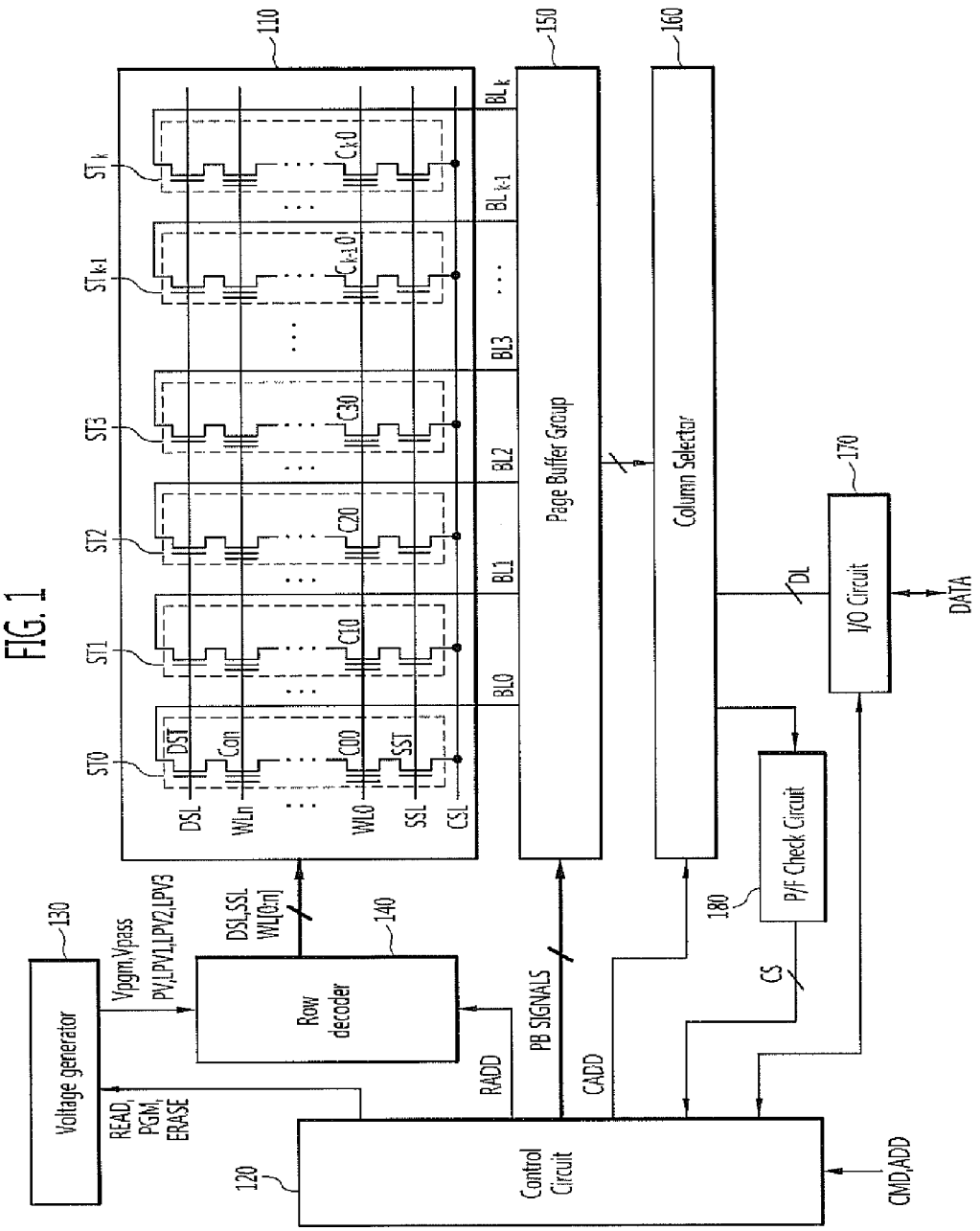
FIG. 1 is a block diagram illustrating a non-volatile memory device according to an exemplary embodiment of this disclosure.

FIG. 1 is a block diagram illustrating a non-volatile memory device according to an exemplary embodiment of this disclosure.

Referring to FIG. 1, the non-volatile memory device according to the exemplary embodiment of this disclosure includes a memory array 110, an operation circuit group (130, 140, 150, 160, 170, and 180) configured to perform a program loop, an erase loop, or a read operation for the memory cells of the memory array 110, and a control circuit 120 configured to control the operation circuit group (130, 140, 150, 160, 170, and 180) for the program loop, the erase loop, or the read operation for the memory cells.

The program loop includes a program operation and a program verification operation. The program verification operation includes a target verification operation for comparing the threshold voltages of the memory cells with a target verification voltage, a first sub-verification operation for comparing a first sub-verification voltage lower than the target verification voltage with the threshold voltages of the memory cells, a second sub-verification operation for comparing a second sub-verification voltage lower than the first sub-verification voltage with the threshold voltages of the memory cells, and a third sub-verification operation for comparing a third sub-verification voltage lower than the second sub-verification voltage with the threshold voltages of the memory cells. The third sub-verification operation may be selectively performed.

The memory array 110 includes a plurality of memory blocks for storing data. For convenience, one of the memory blocks is shown in FIG. 1. Each of the memory blocks includes a plurality of strings ST0 to STk coupled between respective bit lines BL0 to BLk and a common source line CSL. That is, the strings ST0 to STk are coupled to the respective bit lines BL0 to BLk and are in common coupled to the common source line CSL.

Each (for example, ST0) of the strings includes a source select transistor SST having a source coupled to the common source line CSL, a drain select transistor DST having a drain coupled to the bit line BL0, and a plurality of memory cells C00 to C0$n$ coupled in series between the select transistors SST and DST. The gate of the source select transistor SST is coupled to a source select line SSL, the gates of the memory cells C00 to C0$n$ are coupled to respective word lines WL0 to WLn, and the gate of the drain select transistor DST is coupled to a drain select line DSL.

In a NAND flash memory device, each of the memory blocks may be divided on the basis of physical pages or logical pages. A program operation or a read operation is performed for every page (or an even page and an odd page).

For example, the memory cells C00 to Ck0 coupled to one word line WL0 may form one physical page. In some embodiments, even-numbered memory cells C00, C20, . . . , Ck-10 coupled to one word line WL0 may form an even physical page, and odd-numbered memory cells C10, C30, . . . , Ck0 coupled to one word line may form an odd physical page.

Meanwhile, the number of logical pages included in one word line is determined by the number of bits of data stored in a memory cell. For example, if data of 2 bits is stored in a memory cell, two logical pages may be included in one word line. If data of 3 bits is stored in a memory cell, three logical pages may be included in one word line.

In a NAND flash memory device, the operation circuit group may include a voltage supply circuit (130 and 140), a page buffer group 150, a column selector 160, an input/output (I/O) circuit 170, and a pass/fail (P/F) check circuit 180.

The voltage supply circuit (130 and 140) generates operation voltages having various levels, which are used for the program loop for storing data in memory cells, the erase loop for erasing data, or the read operation for reading data, in response to the internal command signal CMDi of the control circuit 120 and supplies the generated operation voltages to the drain select line DSL, the word lines WL0 to WLn, and the source select line SSL of a memory block which is selected in response to a row address RADD. The voltage supply circuit includes a voltage generator 130 and a row decoder 140.

The voltage generator 130 outputs the operation voltages for the program loop, the erase loop, or the read operation to global lines in response to the Internal command signal CMDi of the control circuit 120. For example, the voltage generator 130 outputs operation voltages Vpgm, Vpass, PV, LPV1, LPV2, and LPV3 for a program to the global lines, if memory cells are to be programmed.

The row decoder 140 supplies the operation voltages of the voltage generator 130 to the local lines DSL, WL[0:n], and SSL of a memory block, selected from among the memory blocks of the memory array 110, in response to the row address signals RADD of the control circuit 120.

The page buffer group 150 includes page buffers (not shown) coupled to the respective bit lines BL0 to BLk. The page buffer group 150 supplies voltages for storing data in the memory cells C00, . . . , Ck0, to the respective bit lines BL0 to BLk in response to the control signals PB SIGNALS of the control circuit 120. More particularly, the page buffer group 150 precharges the bit lines BL0 to BLk in the program loop, the erase loop, or the read operation for the memory cells C00, . . . , Ck0 or latches data, corresponding to levels of the threshold voltages of the memory cells C00, . . . , Ck0 which are detected based on a shift in the voltages of the bit lines BL1 to BLk. In other words, the page buffer group 150 controls the voltages of the bit lines BL0 to BLk based on data stored in the memory cells C00, . . . , Ck0 and detects data stored in the memory cells C00, . . . , Ck0.

In particular, under the control of the control circuit 120, the page buffer group 150 may selectively supply a program inhibition voltage (for example, power supply voltage) and program permission voltages of various levels which are lower than the program inhibition voltage to the bit lines BL0 to BLk depending on a shift in the threshold voltages of memory cells or their levels due to a program operation. Although a subsequent program operation is performed, the threshold voltage of a memory cell coupled to a bit line to which the program inhibition voltage has been supplied does not rise any more. The threshold voltage of a memory cell coupled to a bit line to which a program permission voltage having the highest level, among the program permission voltages, has been supplied rises most slightly, and the threshold voltage of a memory cell coupled to a bit line to which a program permission voltage having the lowest level, among the program permission voltages, has been supplied rises most greatly.

The column selector 160 selects the page buffers of the page buffer group 150 in response to the column address signal CADD of the control circuit 120. Data latched in a page buffer selected by the column selector 160 is outputted.

The I/O circuit 170 transfers external data to the column selector 160 during a program operation under the control of the control circuit 120 in order to input the data to the page buffer group 150. When the column selector 160 sequentially transfers the external data to the page buffers of the page buffer group 150, the page buffers latch the received data in their latches. Furthermore, the I/O circuit 170 output data, received from the page buffers of the page buffer group 150 via the column selector 160, in a read operation.

The P/F check circuit 180 checks whether received data is identical with data, stored in memory cells through a program loop, based on a comparison result of target verification voltages and the threshold voltages of the memory cells, latched in the page buffer group 150, in a program verification operation and output a result of the check in the form of a check signal CS.

In other words, the P/F check circuit 180 checks whether there is an error cell having a threshold voltage lower than the target verification voltage among the memory cells during the target verification operation of the program verification operation which is performed after a program operation and outputs a result of the check in the form of the check signal CS. If, as a result of the check, the received data is not identical with the data stored in the memory cells (that is, an error cell, having a threshold voltage lower than a target threshold voltage, is detected among the memory cells for which the program operation has been performed), the P/F check circuit 180 outputs the check signal CS to the control circuit 120 so that the program operation can be performed again.

As described above, the control circuit 120 controls the operation circuit group (130, 140, 150, 160, 170, and 180) for the data I/O operation of the memory cells. For example, the control circuit 120 may output the Internal command signal CMDi in response to the command signal CMD and generates control signals PS SIGNALS for controlling the page buffers of the page buffer group 150 depending on a type of the operation. Furthermore, the control circuit 120 internally generates the row address signal RADD and the column address signal CADD in response to an address signal ADD. Furthermore, the control circuit 120 checks whether the threshold voltages of selected memory cells have risen up to a minimum threshold voltage in response to the check signal CS of the P/F check circuit 180 in a program verification operation and determines whether to perform a program operation again based on a result of the check.

Furthermore, the control circuit 120 controls levels of a program voltage which is supplied to a selected word line in a program operation for memory cells and also controls the voltage generator 130 so that the verification voltages PV, LPV1, LPV2, and LPV3 supplied to a selected word line in a program verification operation can be changed. Here, the control circuit 120 may control the voltage generator 130 in response to the check signal CS of the P/F check circuit 180.

Several methods of operating the semiconductor memory device configured as above are described below.

Figure 2:
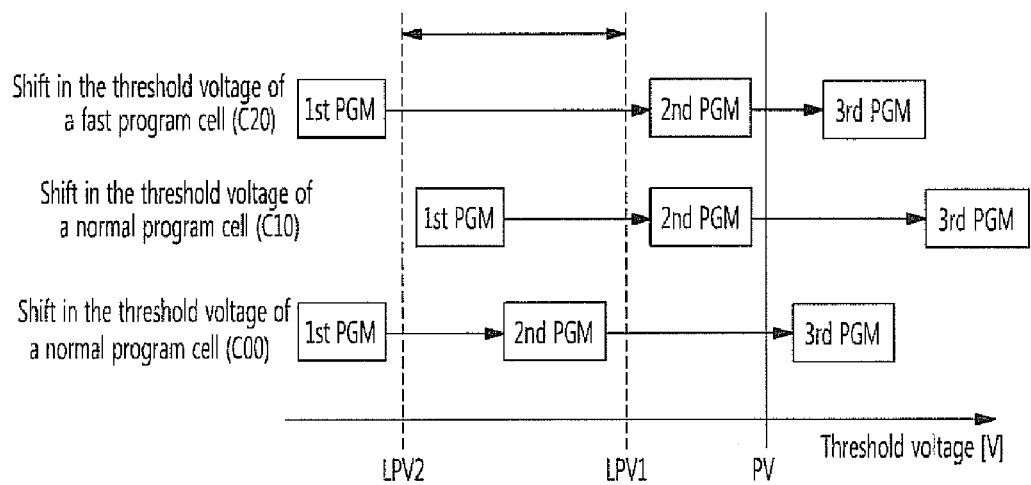
FIG. 2 is a diagram illustrating a method of operating the semiconductor memory device according to an exemplary embodiment of this disclosure.

FIG. 2 is a diagram illustrating a method of operating the semiconductor memory device according to an exemplary embodiment of this disclosure. For example, a program operation shifting the threshold voltages of the memory cells C00, C10, and C20, coupled to a selected word line WL0 in FIG. 1, is described below.

The threshold voltages of the memory cells C00, C10, and C20 may belong to different distribution levels in an erase state or after a program operation. This is because the electrical/physical properties of the memory cells C00, C10, and C20 are varied due to the manufacturing process. Although the same program voltage is supplied to the memory cells C00, C10, and C20, some program cells, i.e., a fast program cell, have a threshold voltage rise much higher than those of other memory cells, i.e., a normal memory cell.

Referring to FIGS. 1 and 2, the threshold voltages (1st PGM) of the memory cells C00, C10, and C20 belong to different distribution levels after a first program operation. Since the memory cells still have a threshold voltage lower than a target verification voltage PV, they are detected in a program verification operation, and the operation circuit group (130, 140, 150, 160, 170, and 180) supplies the program voltage Vpgm to the selected word line WL0 and supplies the program pass voltage Vpass to the other word lines WL1 to WLn. Accordingly, a program operation for storing data in the memory cells C00, C10, and C20 may be performed for a selected page C00 to Ck0.

The threshold voltages of the memory cells C00, C10, and C20 rise through the program operation. It is preferred that the threshold voltages of the memory cells C00, C10, and C20 rise by the same value. The increment values of the threshold voltage, however, are different because the electrical/physical properties of the memory cells C00, C10, and C20 are varied due to the manufacturing process.

After the program operation, a program verification operation is performed using the target verification voltage PV, a first sub-verification voltage, LPV1 and a second sub-verification voltage LPV2 which are sequentially lower than the target verification voltage PV in order to detect levels of the threshold voltages of the memory cells. The program verification operation is performed to check whether all the threshold voltages of the memory cells C00, C10, and C20 are higher than the target verification voltage PV and, at the same time, detect a fast program memory cell (for example, C20) having a threshold voltage which has sharply risen higher than the first sub-verification voltage LPV1 from the second sub-verification voltage LPV2 or lower.

More particularly, the program verification operation includes a first sub-verification operation, a second sub-verification operation, and a target verification operation. Here, the first sub-verification operation is performed to compare each of the threshold voltages of the memory cells C00 to Ck0 with the first sub-verification voltage LPV1 by supplying the first sub-verification voltage LPV1 to the memory cells C00 to Ck0 of the selected page. The second sub-verification operation is performed to compare each of the threshold voltages of the memory cells C00 to Ck0 with the second sub-verification voltage LPV2 by supplying the second sub-verification voltage LPV2 to the memory cells C00 to Ck0 of the selected page. The target verification operation is performed to compare each of the threshold voltages of the memory cells C00 to Ck0 with the target verification voltage PV by supplying the target verification voltage PV to the memory cells C00 to Ck0 of the selected page.

Accordingly, the memory cells may be classified into the memory cell C00 having a threshold voltage lower than the second sub-verification voltage LPV2, the memory cell C10 having a threshold voltage higher than the second sub-verification voltage LPV2 and lower than the first sub-verification voltage LPV1, the fast program memory cell C20 having a threshold voltage sharply risen higher than the first sub-verification voltage LPV1 from the second sub-verification voltage LPV2 or lower, and a memory cell having a threshold voltage higher than the target verification voltage PV, through the program verification operation performed after the program operation.

The program operation is performed again because there are the memory cells C00, C10, and C20, each having the threshold voltage lower than the target verification voltage PV. In this case, the program voltage of the previous program operation is raised by a step voltage and supplied to the memory cells Ca0 to Ck0 of the selected page.

Furthermore, the program operation is performed such that an increment of each of the threshold voltages of the memory cells C00 and C10 is greater than an increment of the threshold voltage of the fast program memory cell C20. To this end, a first program permission voltage (for example, ground voltage) is supplied to the bit lines of the memory cells C00 and C10, each having the threshold voltage lower than the target verification voltage PV. Furthermore, a second program permission voltage higher than the first program permission voltage is supplied to the bit line of the fast program cell C20, and a program inhibition voltage (for example, power supply voltage) higher than the second program permission voltage is supplied to the bit lines of memory cells, each having the threshold voltage higher than the target verification voltage PV.

If the program operation is performed under the above conditions, the threshold voltage of the fast program memory cell C20 rises less than the threshold voltages of the memory cells C00 and C10. Accordingly, the threshold voltage of the fast program memory cell C20 is prevented from being much higher than the target verification voltage PV. Consequently, a distribution of the threshold voltages of the memory cells C00, C10, and C20 may be prevented from being widened after the program operation.

The program verification operation and the program operation are repeatedly performed until all the threshold voltages of the memory cells C00 to Ck0 become higher than the target verification voltage PV depending on stored data.

Figure 3:
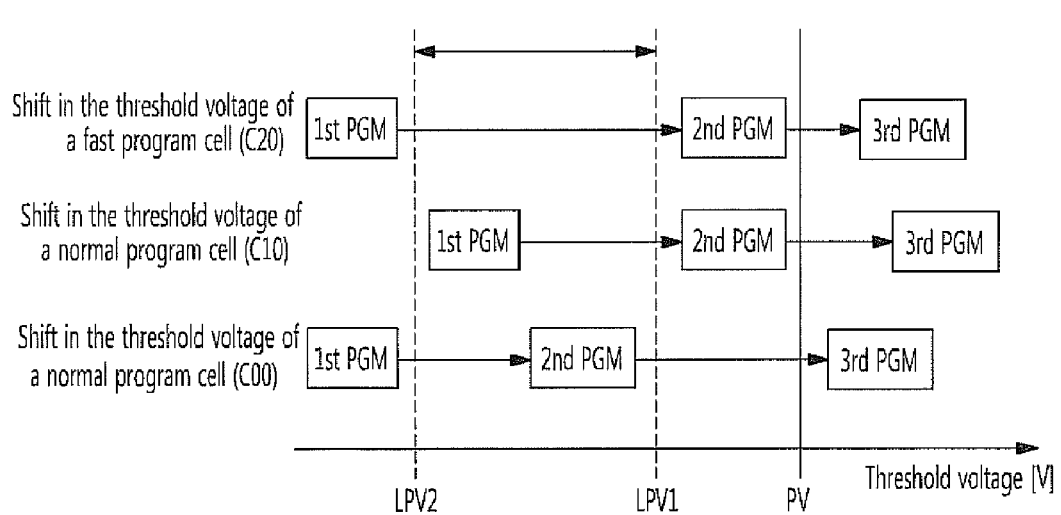
FIG. 3 is a diagram illustrating a method of operating the semiconductor memory device according to another exemplary embodiment of this disclosure.

FIG. 3 is a diagram illustrating a method of operating the semiconductor memory device according to another exemplary embodiment of this disclosure.

Referring to FIGS. 1 and 3, the fast program memory cell C20, having a threshold voltage sharply risen higher than a first sub-verification voltage LPV1 from a second sub-verification voltage LPV2, is detected by performing the program verification operation described with reference to FIG. 2. Next, if there is a memory cell having a threshold voltage lower than a target verification voltage PV, among the memory cells C00, C10, and C20, the program voltage of the previous program operation is raised by a step voltage and supplied to the memory cells C00 to Ck0 of the selected page, and the program operation is then performed again.

Here, the program operation is performed such that an increment of the threshold voltage of the memory cell C00, lower than the first sub-verification voltage LPV1, is greater than an increment of each of the threshold voltage of the memory cell C10, higher than the first sub-verification voltage LPV1 and lower than the target verification voltage PV and the threshold voltage of the fast program memory cell C20.

To this end, a first program permission voltage (for example, ground voltage) is supplied to the bit line of the memory cell C00 having the threshold voltage lower than the first sub-verification voltage LPV1, and a second program permission voltage higher than the first program permission voltage is supplied to the bit line of the memory cell C10, having the threshold voltage higher than the first sub-verification voltage LPV1 and lower than the target verification voltage PV. Furthermore, a third program permission voltage higher than the first program permission voltage is supplied to the bit line of the fast program cell C20, and a program inhibition voltage (for example, power supply voltage) higher than the third program permission voltage is supplied to the bit lines of memory cells, each having a threshold voltage higher than the target verification voltage PV. In this case, the threshold voltage of the fast program cell C20 slightly rises less than the threshold voltage of the memory cell C10.

If the program operation is performed under the above conditions, the threshold voltage of the fast program memory cell C20 rises most slightly, the threshold voltage of the memory cell C00 rises most greatly, and the threshold voltage of the memory cell C10 rises by a middle value. Accordingly, the threshold voltage of the fast program memory cell C20 or the memory cell C10, risen near the target verification voltage PV, may be prevented from rising much higher than the target verification voltage PV. Furthermore, a distribution of the threshold voltages of the memory cells C00, C10, and C20 may be prevented from being widened after the program operation.

Figure 4:
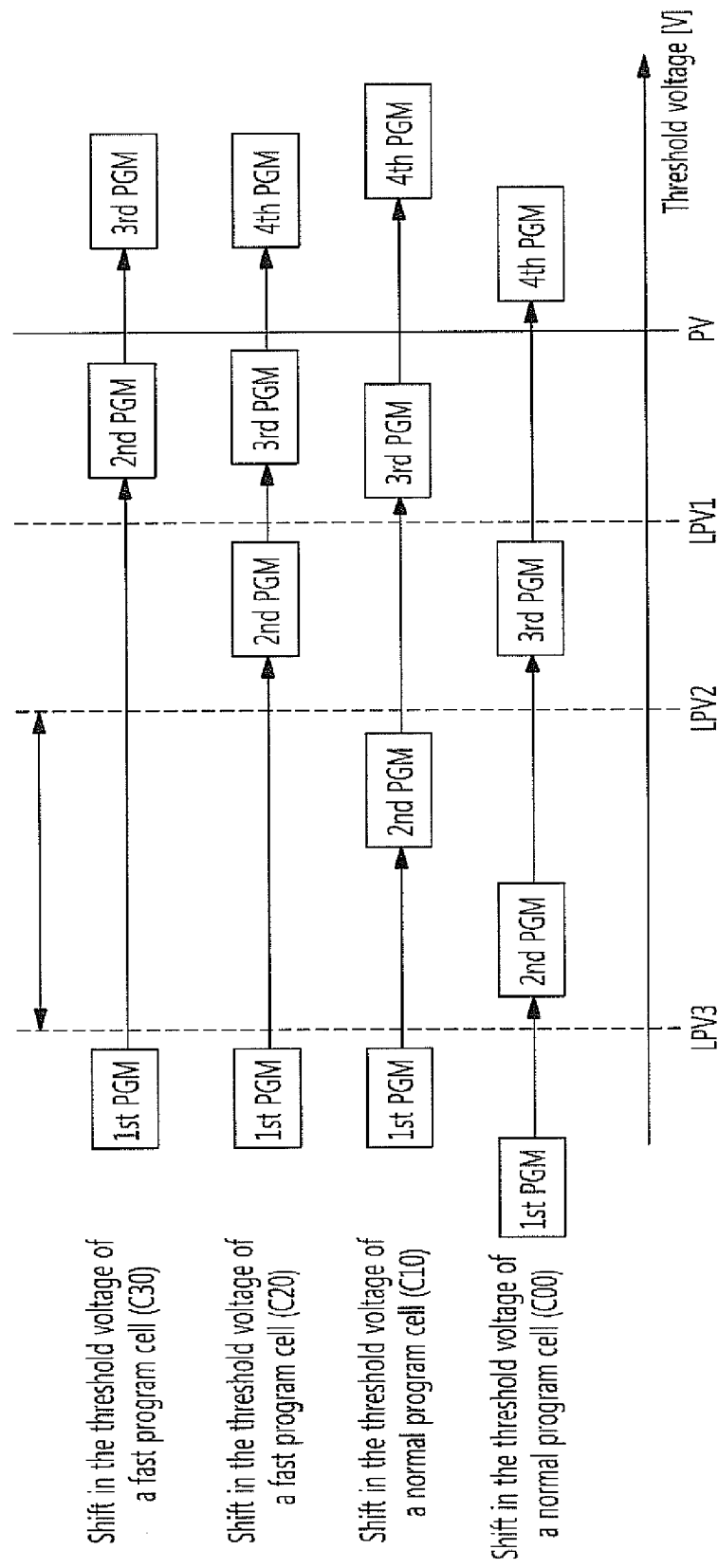
FIG. 4 is a diagram illustrating a method of operating the semiconductor memory device according to yet another exemplary embodiment of this disclosure.

FIG. 4 is a diagram illustrating a method of operating the semiconductor memory device according to yet another exemplary embodiment of this disclosure.

Referring to FIGS. 1 and 4, the threshold voltages (1st PGM) of the memory cells C00, C10, C20, and C30 belong to different distribution levels after a first program operation.

Since the memory cells still have a threshold voltage lower than a target verification voltage PV, they are detected in a program verification operation, and the operation circuit group (130, 140, 150, 160, 170, and 180) supplies the program voltage Vpgm to a selected word line WL0 and supplies the program pass voltage Vpass to the other word lines WL1 to WLn. Accordingly, the program operation for storing data in the memory cells C00, C10, C20, and C30 belonging to a selected page is performed again.

In order to detect levels of the threshold voltages of the memory cells after the program operation, a program verification operation is performed using the target verification voltage PV, a first sub-verification voltage LPV1, a second sub-verification voltage LPV2, and a third sub-verification voltage LPV3 which are sequentially lower than the target verification voltage. The program verification operation is performed to check whether all the threshold voltages of the memory cells C00, C10, C20, and C30 are higher than the target verification voltage PV and, at the same time, to detect the first fast program cell C20, having a threshold voltage sharply risen higher than the second sub-verification voltage LPV2 from the third sub-verification voltage LPV3 or lower, and the second fast program cell C30, having a threshold voltage sharply risen higher than the first sub-verification voltage LPV1 from the third sub-verification voltage LPV3 or lower.

More particularly, the program verification operation includes a first sub-verification operation, a second sub-verification operation, a third sub-verification operation, and a target verification operation. The first sub-verification operation is performed to compare each of the threshold voltages of the memory cells C00 to Ck0 with the first sub-verification voltage LPV1 by supplying the first sub-verification voltage LPV1 to the memory cells C00 to Ck0 of the selected page. The second sub-verification operation is performed to compare each of the threshold voltages of the memory cells C00 to Ck0 with the second sub-verification voltage LPV2 by supplying the second sub-verification voltage LPV2 to the memory cells C00 to Ck0 of the selected page. The third sub-verification operation is performed to compare each of the threshold voltages of the memory cells C00 to Ck0 with the third sub-verification voltage LPV3 by supplying the third sub-verification voltage LPV3 to the memory cells C00 to Ck0 of the selected page. The target verification operation is performed to compare each of the threshold voltages of the memory cells C00 to Ck0 with the target verification voltage PV by supplying the target verification voltage PV to the memory cells C00 to Ck0 of the selected page.

Accordingly, the memory cells are classified into the memory cells C00 and C10, each having a threshold voltage higher than the third sub-verification voltage LPV3 and lower than the second sub-verification voltage LPV2, the first fast program cell C20 having a threshold voltage risen higher than the second sub-verification voltage LPV2 from the third sub-verification voltage LPV3 or lower, the second fast program cell C30 having a threshold voltage sharply risen higher than the first sub-verification voltage LPV1 from the third sub-verification voltage LPV3 or lower, and a memory cell having a threshold voltage higher than the target verification voltage PV, through the program verification operation.

The program operation is performed again because there are the memory cells C00, C10, C20, and C30, each having the threshold voltage lower than the target verification voltage PV. Here, the program voltage of the previous program operation is raised by a step voltage and supplied to the memory cells C00 to Ck0 of the selected pages.

Furthermore, the program operation is performed such that the threshold voltages of the first and the second fast program memory cells C20 and C30 rise less than the threshold voltages of the memory cells C00 and C10 which are lower than the target verification voltage PV. In particular, the program operation is performed under the conditions that the threshold voltage of the second fast program cell C30 which has sharply risen rises less than the threshold voltage of the first fast program cell C20.

To this end, a first program permission voltage (for example, ground voltage) is supplied to the bit lines of the memory cells C00 and C10, each having the threshold voltage lower than the target verification voltage PV (in particular, the second sub-verification voltage LPV2), and second and third program permission voltages are supplied to the bit lines of the first and the second fast program cells C20 and C30. Furthermore, a program inhibition voltage (for example, power supply voltage) is supplied to the bit lines of memory cells, each having a threshold voltage higher than the target verification voltage PV. Here, each of the second and the third program permission voltages is higher than the first program permission voltage and lower than the program inhibition voltage. Furthermore, it is preferred that the third program permission voltage be higher than the second program permission voltage.

If the program operation is performed under the above conditions, each of the threshold voltages of the first and the second fast program memory cells C20 and C30 slightly rises less than each of the threshold voltages of the memory cells C00 and C10. Furthermore, the threshold voltage of the second fast program cell C30 slightly rises less than the threshold voltage of the first fast program cell C20.

If the program verification operation is performed again after the program operation, the memory cells may be classified into the memory cell C30 having the threshold voltage higher than the target verification voltage PV, the memory cells C10 and C20, each having the threshold voltage lower than the target verification voltage PV and higher than the first sub-verification voltage LPV1, and the memory cell C00 having the threshold voltage lower than the first sub-verification voltage LPV1.

Next, in the program operation, the program inhibition voltage is supplied to the bit line BL3 of the memory cell C30 having the threshold voltage higher than the target verification voltage PV, and the first program permission voltage is supplied to the bit line BL0 of the memory cell C00 having the threshold voltage lower than the first sub-verification voltage LPV1. Furthermore, the third program permission voltage is supplied to the bit line BL2 of the fast program memory cell C20 having the threshold voltage lower than the target verification voltage PV. Meanwhile, the second program permission voltage lower than the third program permission voltage may be supplied to the bit line BL1 of the memory cell C10 having the threshold voltage lower than the target verification voltage PV and higher than the first sub-verification voltage, among normal memory cells, so that the threshold voltage of the memory cell C10 is prevented from rising much higher than the target verification voltage PV.

When the program operations and the program verification operations are repeatedly performed as described above, a distribution of the threshold voltages of the memory cells C00, C10, C20, and C30 may be prevented from being widened owing to the threshold voltages of the fast program memory cells C20 and C30.

According to this disclosure, the threshold voltages of fast program cells which rise much higher than the threshold voltages of normal memory cells in a program operation are controlled. Accordingly, a distribution of the threshold voltages of memory cells may be prevented from being widened, and reliability of the operation may be increased.

What is claimed is:

1. A method of operating a semiconductor memory device, comprising:
    performing a first program operation in order to raise threshold voltages of memory cells coupled to a selected word line;
    performing a program verification operation comprising a first sub-verification operation, a second sub-verification operation, a third sub-verification operation and a target verification operation for detecting first fast program memory cells having the threshold voltages risen higher than a second sub-verification voltage from a third sub-verification voltage or lower by the first program operation and second fast program memory cells having the threshold voltages risen higher than a first sub-verification voltage from the third sub-verification voltage or lower by the first program operation, by using a target verification voltage and the first sub-verification voltage, the second sub-verification voltage, and the third sub-verification voltage which are sequentially lower than the target verification voltage; and
    performing a second program operation under a condition that an increment of each of threshold voltages of memory cells which is lower than the second sub-verification voltage is greater than an increment of each of threshold voltages of the first and the second fast program memory cells,
    wherein program permission voltages having different voltage levels are applied to bit lines of the first fast program memory cells and the second fast program memory cells, respectively, during the second program operation.

2. The method of claim 1, wherein the first sub-verification operation compares each of the threshold voltages of the memory cells with the first sub-verification voltage by supplying the first sub-verification voltage to the memory cells,
    the second sub-verification operation compares each of the threshold voltages of the memory cells with the second sub-verification voltage by supplying the second sub-verification voltage to the memory cells,
    the third sub-verification operation compares each of the threshold voltages of the memory cells with the third sub-verification voltage by supplying the third sub-verification voltage to the memory cells, and
    the target verification operation compares each of the threshold voltages of the memory cells with the target verification voltage by supplying the target verification voltage to the memory cells.

3. The method of claim 1, further comprising raising a level of a program voltage supplied to the memory cells, before performing the second program operation,
    wherein the program verification operation, the rise in the level of the program voltage, and the second program operation are repeatedly performed until each of the threshold voltages of the memory cells becomes higher than the target verification voltage.

4. The method of claim 1, wherein the second program operation is performed under a condition that an increment of each of threshold voltages of memory cells which is lower than the first sub-verification voltage is greater than an increment of each of threshold voltages of memory cells which is higher than the first sub-verification voltage, but lower than the target verification voltage.

5. The method of claim 4, wherein when the second program operation is performed,
    a first program permission voltage is supplied to bit lines of memory cells, each having the threshold voltage lower than the second sub-verification voltage,
    a second program permission voltage higher than the first program permission voltage is supplied to bit lines of memory cells, each having the threshold voltage higher than the first sub-verification voltage, but lower than the target verification voltage,
    a third program permission voltage higher than the second program permission voltage is supplied to bit lines of the fast program memory cells,
    a fourth program permission voltage higher than the third program permission voltage is supplied to bit lines of the second fast program memory cells, and
    a program inhibition voltage higher than the fourth program permission voltage is supplied to bit lines of memory cells, each having the threshold voltage higher than the target verification voltage.

6. The method of claim 1, wherein the second program operation is performed under a condition that an increment of each of the threshold voltages of the second fast program memory cells is smaller than an increment of each of the threshold voltages of the first fast program memory cells.

7. The method of claim 6, wherein the second program operation is performed under a condition that an increment of each of threshold voltages of memory cells which is lower than the first sub-verification voltage is greater than an increment of each of threshold voltages of memory cells which is higher than the first sub-verification voltage, but lower than the target verification voltage.

8. The method of claim 7, wherein when the second program operation is performed,
    a first program permission voltage is supplied to bit lines of memory cells, each having the threshold voltage lower than the second sub-verification voltage,
    a second program permission voltage higher than the first program permission voltage is supplied to bit lines of memory cells, each having the threshold voltage higher than the first sub-verification voltage, but lower than the target verification voltage,
    a third program permission voltage higher than the second program permission voltage is supplied to bit lines of the fast program memory cells,
    a fourth program permission voltage higher than the third program permission voltage is supplied to bit lines of the second fast program memory cells, and
    a program inhibition voltage higher than the fourth program permission voltage is supplied to bit lines of memory cells, each having the threshold voltage higher than the target verification voltage.

9. A semiconductor memory device, comprising:
    a memory array configured to comprise memory cells;
    an operation circuit group configured to perform a first program operation for the memory cells and to perform a program verification operation comprising a first sub-verification operation, a second sub-verification operation, a third sub-verification operation and a target verification operation for detecting first fast program memory cells having threshold voltages risen higher than a second sub-verification voltage from a third sub-verification voltage or lower by the first program operation and second fast program memory cells having the threshold voltages risen higher than a first sub-verification voltage from the third sub-verification voltage or lower by the first program operation, by using a target verification voltage and the first sub-verification voltage, the second sub-verification voltage, and the third sub-verification voltage which are sequentially lower than the target verification voltage; and a control circuit configured to control the operation circuit group in order perform a second program operation under a condition that an increment of each of the threshold voltages of memory cells which is lower than the second sub-verification voltage is greater than an increment of each of threshold voltages of the first and the second fast program memory cells, wherein program permission voltages having different voltage levels are applied to bit lines of the first fast program memory cells and the second fast program memory cells, respectively, during the second program operation.

10. The semiconductor memory device of claim 9, wherein the operation circuit group performs the program operation under a condition that an increment of each of threshold voltages of memory cells which is lower than the first sub-verification voltage is greater than an increment of each of threshold voltages of memory cells which is higher than the first sub-verification voltage, but lower than the target verification voltage.

11. The semiconductor memory device of claim 10, wherein when the second program operation is performed, the operation circuit group is configured to:

supply a first program permission voltage to bit lines of memory cells, each having the threshold voltage lower than the second sub-verification voltage, supply a second program permission voltage higher than the first program permission voltage to bit lines of memory cells, each having the threshold voltage higher than the first sub-verification voltage, but lower than the target verification voltage, supply a third program permission voltage higher than the second program permission voltage to bit lines of the fast program memory cells, supply a fourth program permission voltage higher than the third program permission voltage to bit lines of the second fast program memory cells, and supply a program inhibition voltage higher than the fourth program permission voltage to bit lines of memory cells, each having the threshold voltage higher than the target verification voltage.

12. The semiconductor memory device of claim 9, wherein the operation circuit group performs the program operation under a condition that each of the threshold voltages of the second fast program memory cells becomes slightly higher than each of the threshold voltages of the first fast program memory cells.

13. The semiconductor memory device of claim 12, wherein the operation circuit group performs the program operation under a condition that an increment of each of threshold voltages of memory cells which is lower than the first sub-verification voltage is greater than an increment of each of threshold voltages of memory cells which is higher than the first sub-verification voltage, but lower than the target verification voltage.

14. The semiconductor memory device of claim 13, wherein when the second program operation is performed, the operation circuit group is configured to:

supply a first program permission voltage to bit lines of memory cells, each having the threshold voltage lower than the second sub-verification voltage, supply a second program permission voltage higher than the first program permission voltage to bit lines of memory cells, each having the threshold voltage higher than the first sub-verification voltage, but lower than the target verification voltage, supply a third program permission voltage higher than the second program permission voltage to bit lines of the fast program memory cells, supply a fourth program permission voltage higher than the third program permission voltage to bit lines of the second fast program memory cells, and supply a program inhibition voltage higher than the fourth program permission voltage to bit lines of memory cells, each having the threshold voltage higher than the target verification voltage.

* * * * *